United States Patent
Zhang

(10) Patent No.: US 10,727,791 B2
(45) Date of Patent: Jul. 28, 2020

(54) I—V CONVERSION MODULE

(71) Applicant: SHENZHEN GOODIX TECHNOLOGY CO., LTD., Shenzhen, Guangdong (CN)

(72) Inventor: Mengwen Zhang, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 182 days.

(21) Appl. No.: 16/057,216

(22) Filed: Aug. 7, 2018

(65) Prior Publication Data
US 2018/0375481 A1    Dec. 27, 2018

Related U.S. Application Data

(63) Continuation of application No. PCT/CN2016/107205, filed on Nov. 25, 2016.

(51) Int. Cl.
*H03F 3/08* (2006.01)
*H03F 1/42* (2006.01)
(Continued)

(52) U.S. Cl.
CPC .............. *H03F 1/42* (2013.01); *G01B 15/00* (2013.01); *H03F 1/0211* (2013.01); *H03F 3/005* (2013.01);
(Continued)

(58) Field of Classification Search
CPC .................................... H03F 3/08; H03F 1/12
(Continued)

(56) References Cited

U.S. PATENT DOCUMENTS 4,902,886 A    2/1990 Smisko
7,400,121 B2 * 7/2008 Martins .................. G05F 1/468
323/269
(Continued)

FOREIGN PATENT DOCUMENTS

CN    202085151 U    12/2011
CN    102566641 A    7/2012
(Continued)

OTHER PUBLICATIONS

Extended European Search Report for European Patent Application No. 16922161.1 dated Mar. 7, 2019.
(Continued)

*Primary Examiner* — Henry Choe
(74) *Attorney, Agent, or Firm* — Heslin Rothenberg Farley & Mesiti P.C.

(57) ABSTRACT

An I-V conversion module includes: a current output type sensor, a pre-integral circuit, a charge transfer auxiliary circuit, and an I-V transformation circuit including an inverting amplifier. The current output type sensor is connected to an input end of the I-V transformation circuit through the pre-integral circuit. The charge transfer auxiliary circuit connects in parallel with the inverting amplifier. When both the pre-integral circuit and the charge transfer auxiliary circuit are open circuits, the pre-integral circuit pre-integrates the induction current output by the current output type sensor to store pre-integral charges. When both pre-integral circuit and the charge transfer auxiliary circuit are closed circuits, the pre-integral charges are transferred to the I-V transformation circuit. In these embodiments, both the time for establishing the I-V conversion module and power consumption can be reduced.

10 Claims, 4 Drawing Sheets

(51) Int. Cl.
  *H03K 19/14* (2006.01)
  *H03G 1/00* (2006.01)
  *H03G 3/30* (2006.01)
  *G01B 15/00* (2006.01)
  *H03G 3/00* (2006.01)
  *H03F 3/70* (2006.01)
  *H03F 3/72* (2006.01)
  *H03F 3/00* (2006.01)
  *H03F 1/02* (2006.01)
  *H03K 3/012* (2006.01)
  *G05F 1/565* (2006.01)
  *H03G 5/12* (2006.01)

(52) U.S. Cl.
  CPC .............. *H03F 3/70* (2013.01); *H03F 3/72* (2013.01); *H03G 1/0094* (2013.01); *H03G 3/008* (2013.01); *H03G 3/3031* (2013.01); *H03K 3/012* (2013.01); *H03K 19/14* (2013.01); *G05F 1/565* (2013.01); *H03F 2200/156* (2013.01); *H03F 2200/159* (2013.01); *H03F 2200/213* (2013.01); *H03F 2200/231* (2013.01); *H03F 2200/264* (2013.01); *H03F 2200/36* (2013.01); *H03G 5/12* (2013.01)

(58) Field of Classification Search
  USPC .................................. 330/51, 308
  See application file for complete search history.

(56) References Cited

U.S. PATENT DOCUMENTS

| | | | |
|---|---|---|---|
| 8,725,005 B2* | 5/2014 | Koo | H03K 5/05 250/214 A |
| 2003/0161640 A1 | 8/2003 | Sulfeta et al. | |
| 2011/0037527 A1* | 2/2011 | Shrivastava | H03B 5/06 331/158 |
| 2014/0177304 A1* | 6/2014 | Sadwick | H02M 7/06 363/126 |

FOREIGN PATENT DOCUMENTS

| | | |
|---|---|---|
| CN | 102651633 A | 8/2012 |
| CN | 103383404 A | 11/2013 |
| JP | S5933912 A | 2/1984 |

OTHER PUBLICATIONS

Williams, J., "Application Note 21 Composite Amplifiers", pp. 1-12 (1986). Retrieved from the Internet: URL:https://www.analog.com/media/en/techical-documentation/application-notes/an21f.pdf.

Dennis, L.F., "Handbook of Analog Circuit Design Chapter 10 High-Performance Amplification", Academic Press Limited, pp. 487-491 (1990).

International Search Report dated Sep. 1, 2017 for corresponding international application No. PCT/CN2016/107205.

* cited by examiner

I—V CONVERSION MODULE

CROSS REFERENCE TO RELATED APPLICATIONS

The present application is a continuation of international application No. PCT/CN2016/107205, filed on Nov. 25, 2016, which is hereby incorporated by reference in its entirety.

TECHNICAL FIELD

The present disclosure relates to the field of electronic technologies and, more particularly, to an I-V conversion module.

BACKGROUND

As shown in FIG. 1, an existing current-voltage conversion module, i.e., an I-V conversion module, is composed of a current output sensor 1'' and an I-V transformation circuit 2''. The larger the open-loop gain of the inverting amplifier X, the larger the bandwidth, and the faster the response time of the I-V transformation circuit 2''.

As shown in FIG. 1, $\varphi_1$ and $\varphi_2$ are two-phase non-overlapping clocks. As the I-V transformation circuit 2'' is of a symmetric structure, the working process of the I-V conversion module is illustrated by an example of $\varphi_1=1$ (An example of $\varphi_2=1$ can be understood in a same way). When $\varphi_1=1$, a switch $S_1$ is switched on, a capacitor $C_1$ forms a negative feedback loop with the inverting amplifier X, and an input voltage of the I-V transformation circuit 2'' is constantly a middle point voltage of the inverting amplifier X. Thus, an output current $I_0$ of the current type sensor 1'' does not flow through a parasitic capacitor $C_0$ of the sensor and flows through the capacitor $C_1$.

If $A_0$ is a low-frequency open-loop gain of the amplifier, p is a bandwidth, s is a Laplace operator, and $V_{op}$ is an output voltage of a branch of the I-V transformation circuit 2. With the assumption that the open-loop gain of the inverting amplifier X is $A(s)=A_0 p/(s+p)$, a transfer function of the I-V conversion module can be obtained:

$$(V_{op}(s))/(I_o(s))=(A_o p)/s[s(C_o+C_1)+p(C_o+C_1+A_o C_1)] \quad \text{(Formula 1)}$$

An input step signal can be derived from the formula 1, and expression of a response of the output I-V transformation circuit is:

$$y_1(t)=[(I_0 t)/C_1]\cdot LG/(LG+1)\{1-[1/(p(LG+1)t)][1-e^{-(LG+1)pt}]\} \quad \text{(Formula 2)}$$

where $LG=A_0\beta$, $\beta=C_1/(C_0+C_1)$.

The inventor finds the following issue in the existing technologies: it is seen from Formula 2 that the low-frequency open-loop gain $A_0$ and the bandwidth P of the amplifier can affect the response time of the I-V transformation circuit, which results a longer response time of the I-V transformation circuit. In order to solve this issue, it is necessary to increase the open loop gain A(s) and −3 dB bandwidth p of the inverting amplifier X. In other words, the inverting amplifier X shall have a sufficiently large gain-bandwidth product (usually 10 times the inverse of the I-V conversion time). However, according to the theory, when the gain-bandwidth product increases by 2 times, power consumption of the inverting amplifier X increases by 4 times. As a result, although the method may meet the needs for establishing an I-V conversion module, power consumption by the inverting amplifier X is too high.

SUMMARY

Some embodiments of the present disclosure aim at providing an I-V conversion module, which requires less time for establishing the I-V conversion module with lower power consumption.

To solve the above technical problem, some embodiments of the present disclosure provide an I-V conversion module, which comprises a current output type sensor, a pre-integral circuit, a charge transfer auxiliary circuit, and an I-V transformation circuit including an inverting amplifier; the current output type sensor connects to an input end of the I-V transformation circuit through the pre-integral circuit; the charge transfer auxiliary circuit connects in parallel with the inverting amplifier; wherein when both the pre-integral circuit and the charge transfer auxiliary circuit are open circuits, the pre-integral circuit pre-integrates the induction current that is output by the current output type sensor so as to store pre-integral charges; when both pre-integral circuit and the charge transfer auxiliary circuit are closed circuit, the pre-integral charges are transferred to the I-V transformation circuit.

In some embodiments of the present disclosure, compared with the existing technologies, the I-V conversion module includes a pre-integral circuit and a charge transfer auxiliary circuit. The pre-integral circuit is used to pre-integrate an induction current, and the pre-integral charges can be quickly transferred to the I-V transformation circuit by using the gain-bandwidth product of the inverting amplifier. Consequently, the I-V conversion module requires less time when the I-V conversion module establishes an output voltage that is the same as an existing I-V conversion module. Further, power consumption can be greatly reduced by some embodiments of the present disclosure.

Optionally, a pre-integral energy storage unit may include an adjustable energy storage element which is connected in parallel with the coupling capacitor. In this embodiment, the adjustable energy storage element can increase energy storage capacity of the pre-integral energy storage unit; when a pre-integral switch is disconnected, it can smooth out a magnitude drop of the input voltage of the I-V transformation circuit. That is, the adjustable energy storage element can reduce nonlinearity of the current output type sensor.

Optionally, the number of the transformation branches is 2. In this embodiment, two transformation branches can output differential voltage signals to realize differential output characteristics and facilitate subsequent demodulation of signals through positive and negative cancellation. This can be widely applied.

Optionally, the I-V transformation circuit also can include a reset switch which is connected in parallel with the inverting amplifier. In this embodiment, the reset switch is added to facilitate clearance of charges in the I-V transformation circuit so as to meet the requirements for detection.

BRIEF DESCRIPTION OF THE DRAWING FIGURES

One or more embodiments are exemplified by the corresponding figures in the accompanying drawings, which do not put a limit to the embodiment, and the elements with the same reference numbers in the drawings are expressed as similar elements. The figures in the accompanying drawings do not present a proportional limit unless specifically declared.

DETAILED DESCRIPTION

In order to make a purpose, a technical solution and advantages of the present disclosure clearer, some embodiments of the invention will be described in detail in accordance with the drawings. However, those ordinarily skilled in the art can understand that in the various embodiments of the invention, many technical details are proposed to enable a reader to better understand the application. However, even without these technical details and changes and modifications to the following embodiments, the technical solutions claimed for protection in this application can still be realized.

Figure 2:
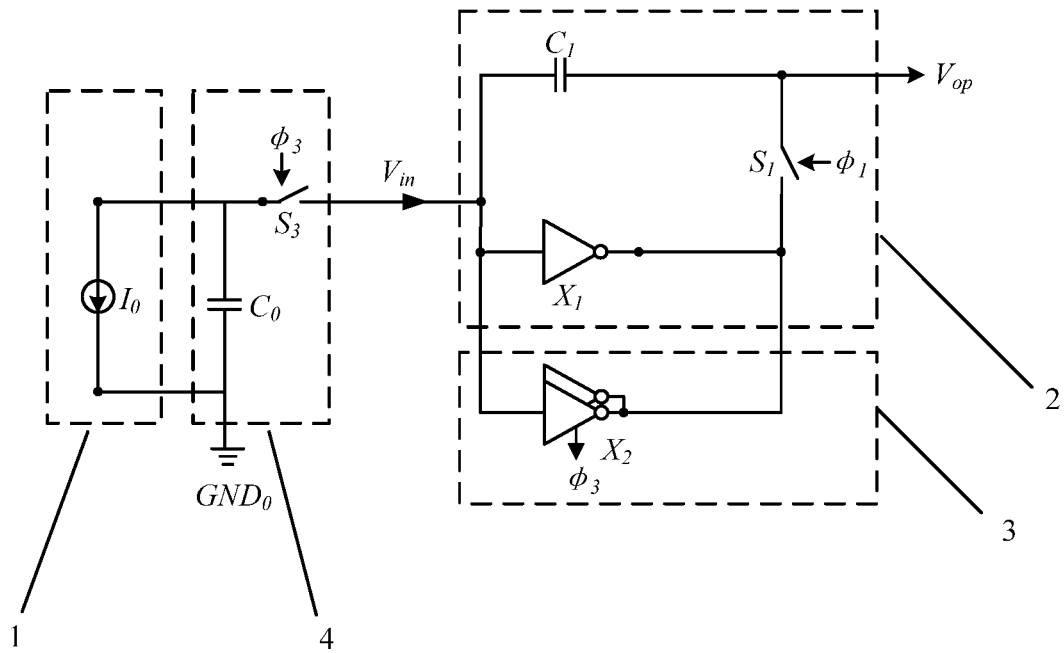
FIG. 2 is a schematic diagram of the I-V conversion module according to a first embodiment of the present disclosure.

A first embodiment of the present disclosure provides an I-V conversion module. As shown in FIG. 2, the I-V conversion module includes: a current output type sensor 1, an I-V transformation circuit 2 including an inverting amplifier $X_1$, a charge transfer auxiliary circuit 3, and a pre-integral circuit 4.

In this embodiment, the current output type sensor 1 is connected to an input end $V_{in}$ of the I-V transformation circuit 2 via the pre-integral circuit 4; and the charge transfer auxiliary circuit 3 is connected in parallel with the inverting amplifier $X_1$.

In this embodiment, as shown in FIG. 2, the I-V transformation circuit 2 also includes a transformation branch which includes an integral energy storage element $C_1$ and an integral switch $S_1$. A first end of the integral energy storage element $C_1$ is connected to an input end of the inverting amplifier $X_1$ and forms an input end $V_{in}$ of the I-V transformation circuit; a second end of the integral energy storage element $C_1$ is connected to the first end of the integral switch $S_1$ and forms an output end $V_{OP}$ of the I-V transformation circuit 2; the output end of the inverting amplifier $X_1$ is connected to the second end of the integral switch $S_1$.

In this embodiment, the integral energy storage element is a capacitor. However, in fact it is not limited to this, and it can be applied to other integral energy storage elements.

In this embodiment, the charge transfer auxiliary circuit 3 includes a plurality of inverting amplifiers $X_2$ that are connected in parallel with each other. The charge transfer auxiliary circuit 3 can be switched on or off by enabling or disabling the inverting amplifiers $X_2$.

Specifically, an input end of each inverting amplifier $X_2$ is connected to the input end of the inverting amplifier $X_1$, and an output end of each inverting amplifier $X_2$ is connected to the output end of the inverting amplifier $X_1$ and the second end of the integral switch $S_1$.

It should be noted that in this embodiment, a plurality of inverting amplifiers $X_2$ are used to provide sufficient gain-bandwidth product to transfer charges. When the number of the inverting amplifiers $X_2$ is N, N is greater than 1 and is an integer. The number of N of the inverting amplifier $X_2$ relates to a gain multiplier of the I-V conversion circuit. The greater the gain multiplier, the greater the number N of the inverting amplifier $X_2$. In this embodiment, there is no limit to the number N of the inverting amplifier $X_2$, and it may be set according to practical situations.

In this embodiment, the pre-integral circuit 4 includes a pre-integral energy storage unit and a pre-integral switch $S_3$. One end of the pre-integral energy storage unit is connected to a first end of a pre-integral switch $S_3$ and the current output type sensor 1, and the other end of the pre-integral energy storage unit is grounded $GND_0$. The second end of the pre-integral switch $S_3$ is connected to the input end $V_{in}$ of the I-V transformation circuit 2. In this embodiment, the pre-integral energy storage unit includes a coupling capacitor $C_0$ of the current output type sensor 1 per se.

In this embodiment, the inverting amplifier (X1 or X2) includes an inverter or an operational amplifier, to which this embodiment does not put any limit.

Figure 3:
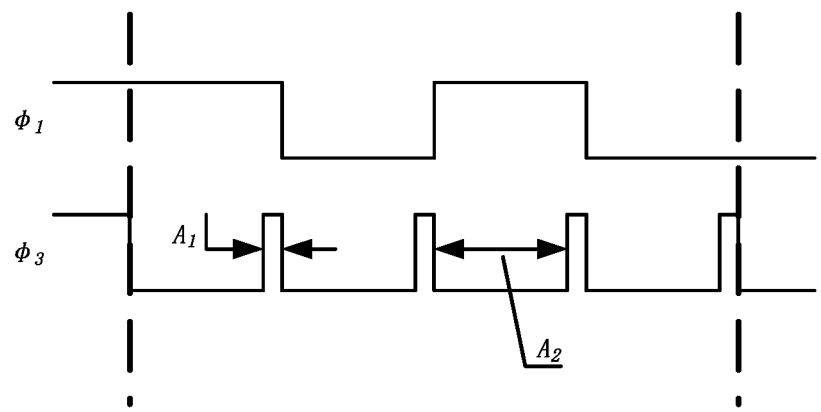
FIG. 3 is a schematic diagram of timing control of the I-V conversion module according to the first embodiment.

In this embodiment, as shown in FIG. 2 and FIG. 3, $\varphi_1$ is a two-phase non-overlapping clock, and a clock signal $\varphi_3$ controls the conduction of the inverting amplifier $X_2$ with the pre-integral switch $S_3$. Next, take $\varphi_1=1$ as an example to illustrate the working process of the I-V conversion module.

Specifically, when $\varphi_1 1=1$ and $\varphi_3=0$, the integral switch $S_1$ is on and the pre-integral switch $S_3$ is off. The inverter amplifier $X_1$ works. At this time, both the pre-integral circuit 4 and the charge transfer auxiliary circuit 3 are open circuits, and the pre-integral circuit 4 pre-integrates the induction current $I_0$ output by the current output type sensor 1. That is, the coupling capacitor $C_0$ pre-integrates the induction current $I_0$ to store the pre-integral charges. At the same time, the inverting amplifier $X_2$ does not work, and the inverting amplifier $X_1$ forms a negative feedback loop with the capacitor $C_1$, thereby maintaining the charges in the capacitor $C_1$.

Specifically, when $\varphi_1=1$ and $\varphi_3=1$, the integral switch $S_1$ is on, and the pre-integral switch $S_3$ is on. At this time, both the pre-integral circuit 4 and the charge transfer auxiliary circuit 3 are closed circuit; the inverting amplifier X2 provides a sufficient gain-bandwidth product, and the pre-integral charges are transferred to the I-V transformation circuit 2. That is, the pre-integral charge is transferred from the coupling capacitor $C_0$ to the integral energy storage element $C_1$, and is kept by the integral energy storage element $C_1$. The voltage of the input end $V_{in}$ of the I-V transformation circuit 2 is restored to the voltage at the middle point of the inverting amplifier $X_1$.

Generally, in this embodiment, the conversion process of the I-V conversion module can be deemed as an equivalent of inputting a step response between 0 and $I_0 T_{int}/(C_0+C_3)$ to a ground plate of a coupling capacitor $C_0$, wherein $T_{int}$ is pre-integration time. Therefore, the step response expression of the process can be obtained as follows:

$$y_2(t)=[(I_0 T_{int})/C_1]*[LG/(LG+1)][1-e^{\wedge}(-(LG+1)pt)] \quad \text{(Formula 3)}$$

Figure 1:
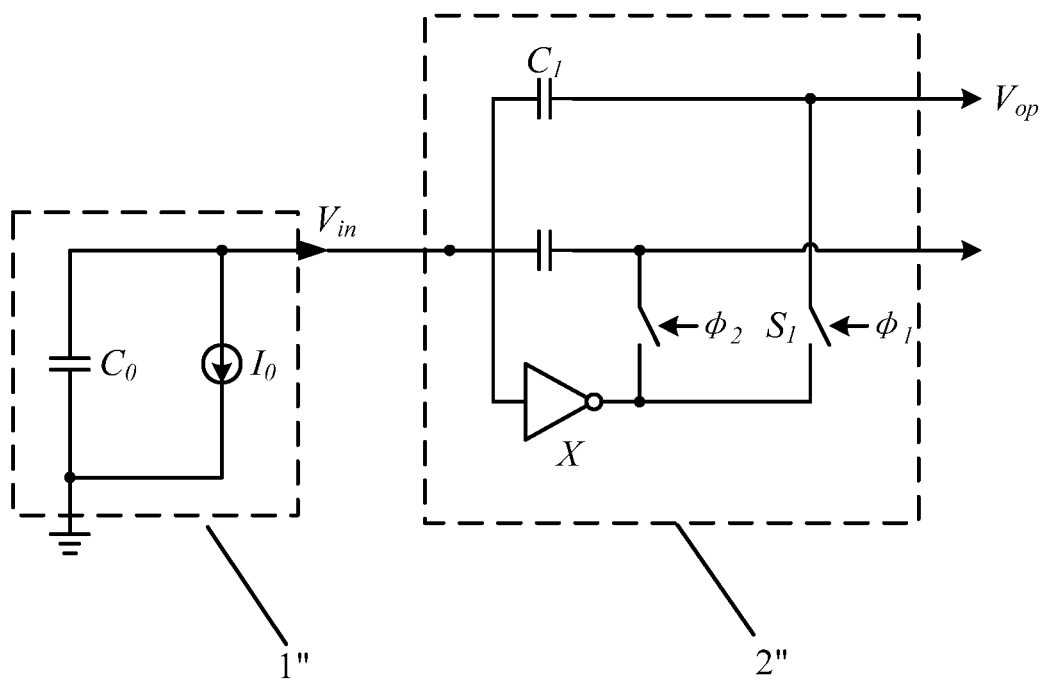
FIG. 1 is a schematic diagram of an I-V conversion module in related art.

Suppose the pre-integration time is $T_{int}=10$ uS, $C_0=50$ pF, $C_1=100$ pF, p=100 rad/s, $A_0=10$ k. These parameters can be applied to the formula 2 and formula 3 in the present disclosure, and the curves can be drawn as shown in FIG. 4 to respectively correspond to the curves of the output step response of the I-V conversion module in FIG. 1 and FIG. 2.

Figure 4:
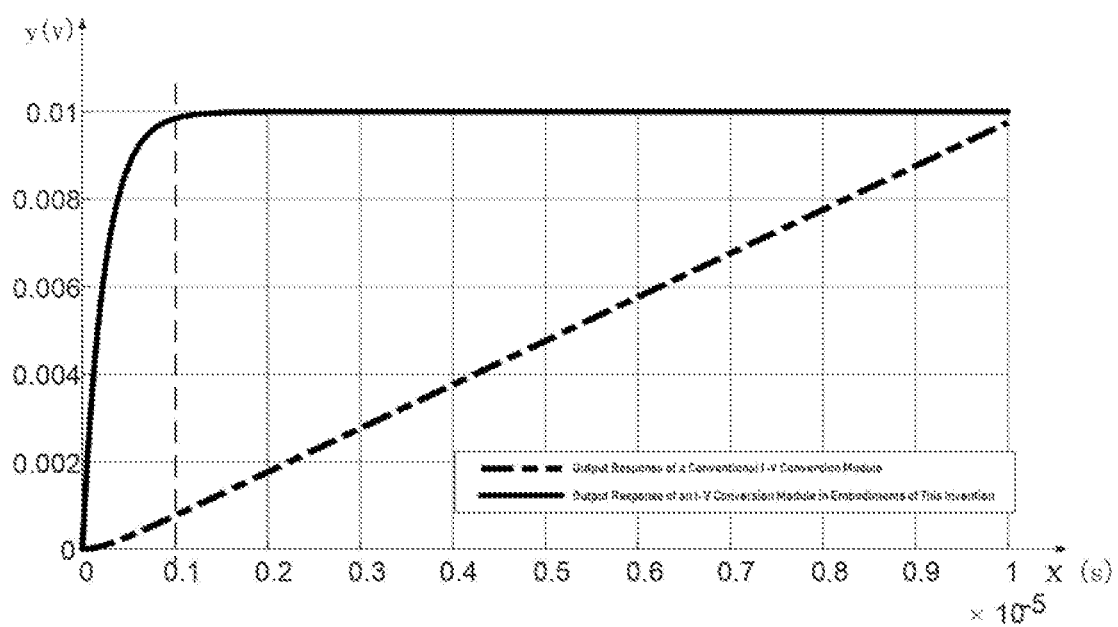
FIG. 4 is a curve diagram of comparison between output step responses in the I-V conversion module in the first embodiment and output step responses in the I-V conversion module in the related art.

As shown in FIG. 4, the horizontal axis X represents a response time, and the y axis represents an amplitude of the output voltage; the dotted line represents an output response of an existing conventional I-V conversion module, and the solid line represents an output response of the I-V conversion module of the present disclosure. It can be seen that the I-V conversion module sets up a same output voltage as compared with the existing conventional I-V conversion module, e.g., establishing a voltage of 0.01V. The existing conventional I-V conversion module needs $10^{-5}$ Us, while the I-V conversion module of this embodiment only needs 0.1*10−5 Us. It is clear that the time required by the I-V conversion module is only 1/10 of the time required by a conventional I-V conversion module.

In this embodiment, the total power consumption of the inverting amplifier $X_1$ and the inverting amplifier $X_2$ is equal to the total power consumption of the inverting amplifier in the existing conventional I-V conversion module. As shown in FIG. 3, in the A1 and A2 time periods, the inverting amplifier has been in a working state in the existing conventional I-V conversion module, that is, the inverting amplifier has been consuming energy. In the I-V conversion module of the embodiment of this invention, the inverting amplifier $X_1$ and the inverting amplifier $X_2$ work simultaneously during the $A_1$ time period; the inverting amplifier $X_1$ works and the inverting amplifier $X_2$ does not work during the $A_2$ time period. Accordingly, in this embodiment, only the inverting amplifier $X_1$ has power consumption during the $A_2$ time period, and the overall I-V conversion module needs less power consumption as compared with that in the existing technologies. That is, the entire I-V conversion module during the A2 time period is in a power-saving mode. Therefore, compared with the existing conventional I-V conversion module, the I-V conversion module in this embodiment greatly reduces the total power consumption. Further, in this embodiment, the A1 time period is 1/10 of the A2 time period. That is, the conversion mode takes up only 1/10 of the time of the power saving mode. Therefore, the inverting amplifier $X_1$ works with the inverting amplifier $X_2$ for a very short time, and the power consumption is very low. It can be generally assumed that the average power consumption by the I-V conversion module in this embodiment is only 1/10 of an average power consumption by the existing conventional I-V conversion module.

In this embodiment, compared with the existing technologies, the I-V conversion module includes a pre-integration circuit and a charge transfer auxiliary circuit. It takes only 1/10 of the existing time required to pre-integrate the induction current by using the parasitic capacitor of the current type sensor, and to transfer the pre-integral charge to the I-V transformation circuit by using the gain-bandwidth product provided by the inverting amplifier, so that the I-V conversion module establishes the same output voltage as the existing I-V conversion module does. Besides, the average power consumption by the I-V conversion module in this embodiment may be only 1/10 of the average power consumption by the existing I-V conversion module, thereby greatly reducing the power consumption.

A second embodiment of the present disclosure relates to an I-V conversion module. The second embodiment is generally the same as the first embodiment, and the main difference is that the number of transformation branches is 1 in the I-V transformation circuit in the first embodiment.

Figure 5:
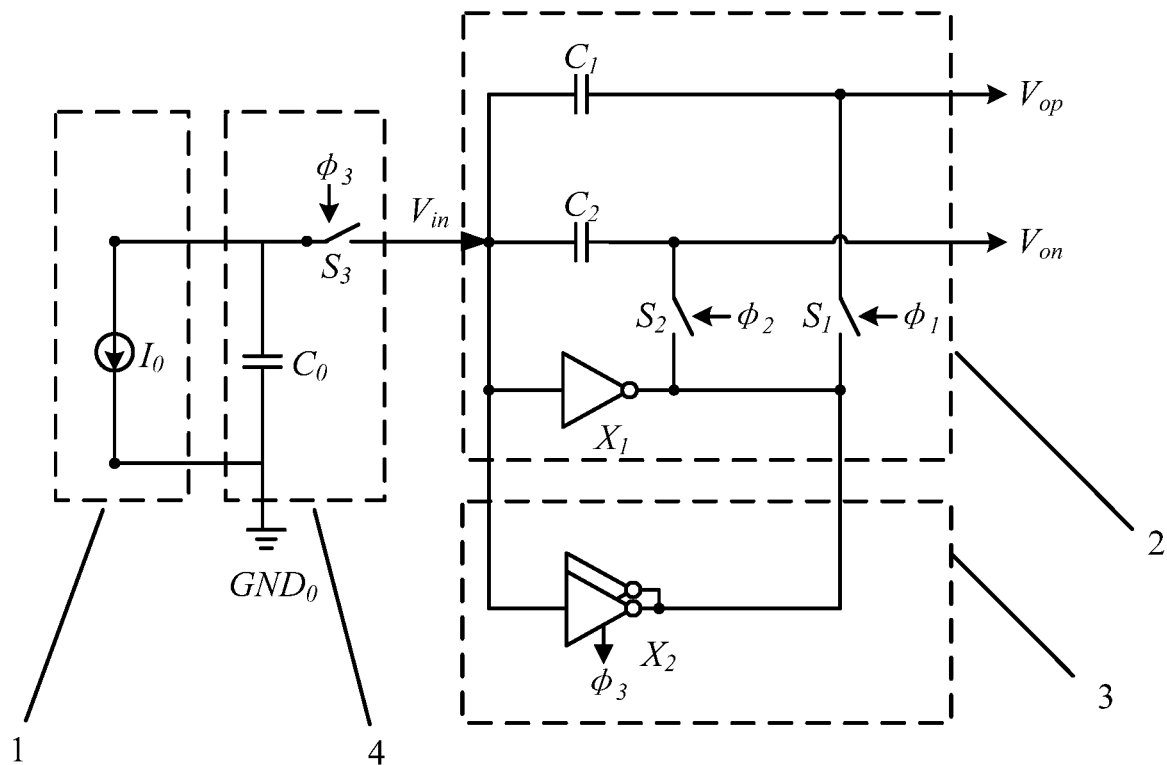
FIG. 5 is a schematic diagram of the I-V conversion module according to a second embodiment of the present disclosure.

As shown in FIG. 5, the number of transformation branches is 2 in the second embodiment of the present disclosure.

In this embodiment, an additional transformation branch includes the integral energy storage element $C_2$ and the integral switch $S_2$. The first end of the integral energy storage element $C_2$ is connected to the input end of the inverting amplifier $X_1$; the second end of the integral energy storage element $C_2$ is connected to the first end of the integral switch $S_2$ and forms another output end $V_{on}$ of the I-V transform circuit; the second end of the integral switch $S_2$ is connected to the output end of the inverting amplifier $X_1$.

Figure 6:
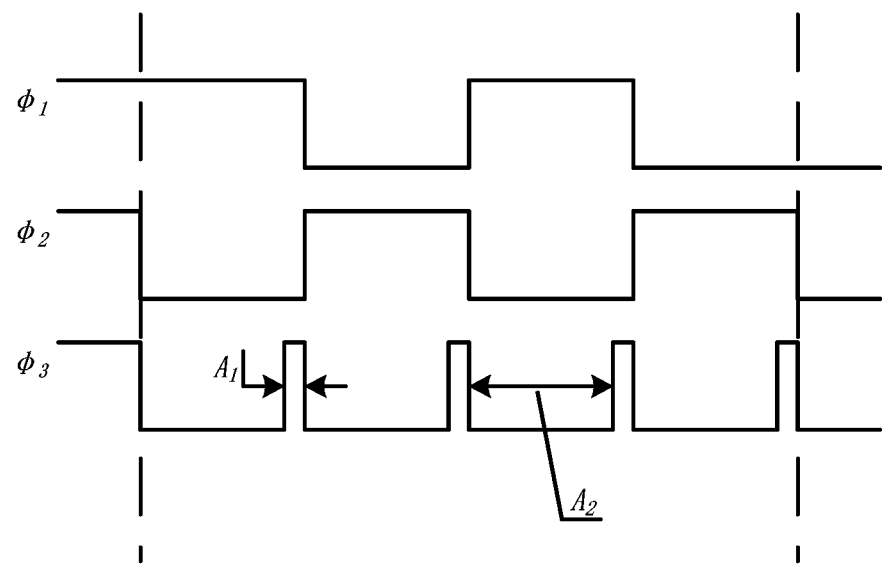
FIG. 6 is a schematic diagram of timing control of the I-V conversion module according to the second embodiment.

In this embodiment, as shown in FIG. 6 there is a control sequence diagram. φ1 and φ2 are two-phase non-overlapping clocks. The I-V transform circuit 2 is of a symmetric structure. Therefore, for φ2=1, the working process can be obtained according to the same conditions of φ1=1. Specifically, the working process of the I-V conversion module for φ1=1 can be understood by reference to the first embodiment, and will not be repeated.

In fact, in the I-V transformation circuit 2, this embodiment does not put any limit to the number of the transformation branches, and the M transformation branches can be set as desired, M being a positive integer greater than zero.

As compared with the first embodiment, this embodiment applies two transformation branches in the I-V transformation circuit and each transformation branch can output differential voltage signals, which can enable the differential output characteristic, and facilitate subsequent demodulation of the signals through positive and negative cancellation. This allows to be more widely applied.

A third embodiment of the present disclosure relates to an I-V conversion module. The third embodiment is improved on the basis of the second embodiment, and the main improvement is that in the third embodiment of the present disclosure, as shown in FIG. 7, the pre-integral energy storage unit can include an adjustable energy storage element $C_3$ in the pre-integral circuit 4.

In this embodiment, the adjustable energy storage element $C_3$ is connected in parallel with the coupling capacitor $C_0$. That is, one end of the adjustable energy storage element $C_3$ is connected to the first end of the coupling capacitor $C_0$ and the pre-integral switch $S_3$, and the other end is grounded (connected to $GND_1$).

Figure 7:
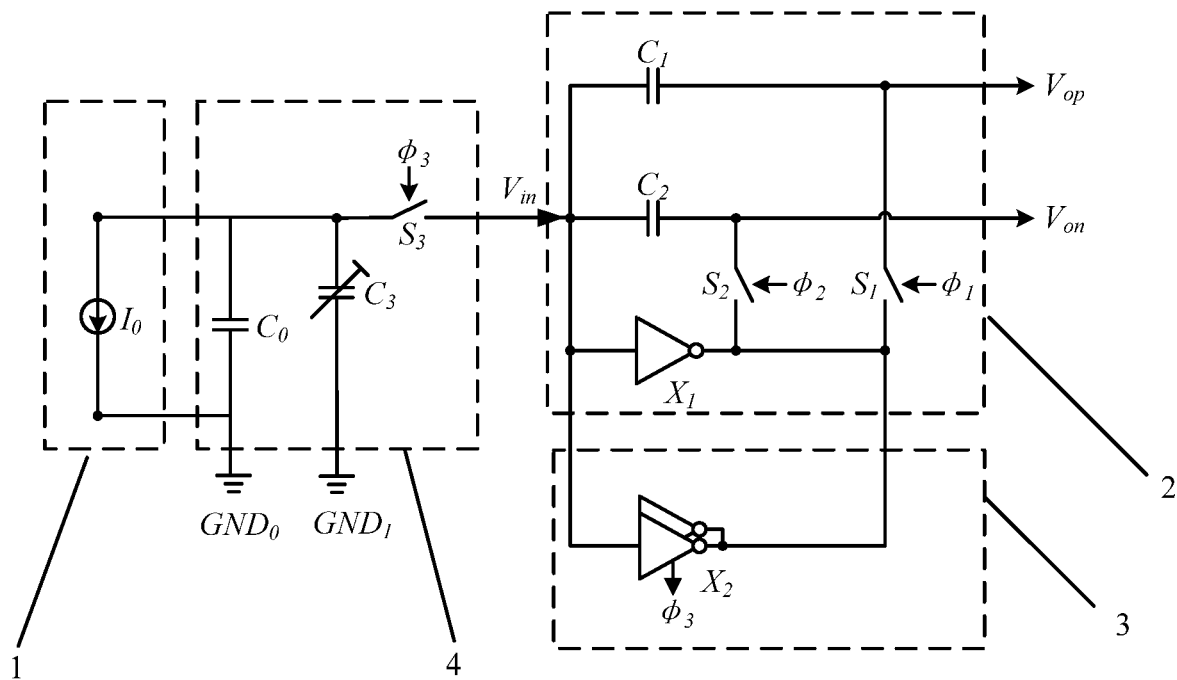
FIG. 7 is a schematic diagram of the I-V conversion module according to a third embodiment of the present disclosure.

In this embodiment, as shown in FIG. 7, the adjustable energy storage element $C_3$ is an adjustable capacitor, but in practice, the adjustable energy storage element $C_3$ may include any components with energy storage functions.

It shall be noted that in this embodiment, the capacitance of the adjustable energy storage element $C_3$ is related to the capacitance of the coupling capacitor $C_0$ and the induction current $I_0$. The larger the coupling capacitor $C_0$ and the smaller the induction current $I_0$, the larger the adjustable energy storage element $C_3$. Therefore, the adjustable energy storage element $C_3$ can be adjusted in the range of [0, ∞) in accordance with the capacitance of the coupling capacitor $C_0$ and the induction current $I_0$. This embodiment does not put any limit to the specific capacitance of the adjustable capacitance $C_3$ which can be adjusted according to the actual situations.

In the embodiment of the present disclosure, compared with the second embodiment, by adding the adjustable energy storage elements in the pre-integral circuit can improve energy storage capacity of the pre-integral energy storage unit. When the pre-integration switch is disconnected, it can smooth out the magnitude drop of the input voltage of the I-V transform circuit. That is, the adjustable energy storage element can reduce the nonlinearity of the current output type sensor.

Figure 8:
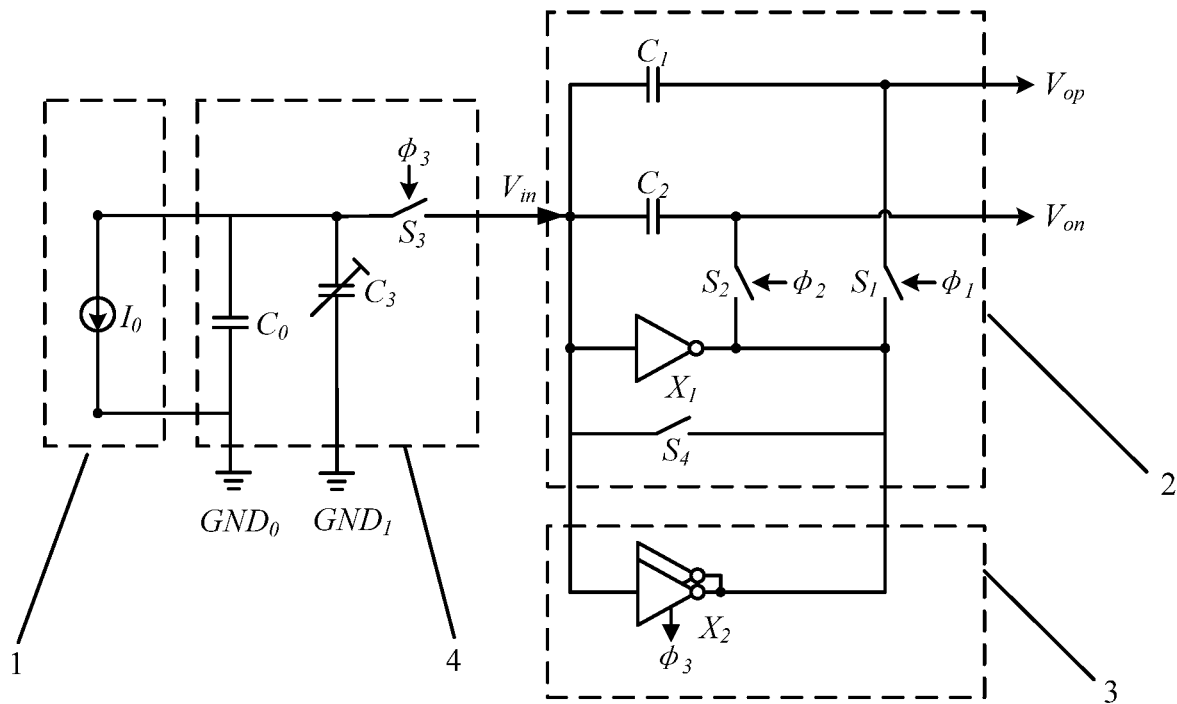
FIG. 8 is a schematic diagram of the I-V conversion module according to a fourth embodiment of the present disclosure.

The fourth embodiment of the present disclosure relates to an I-V conversion module. The fourth embodiment is improved on the basis of the third embodiment, and the main improvement is that in the fourth embodiment of the present disclosure, as shown in FIG. 8, the I-V transformation circuit also includes a reset switch $S_4$.

In this embodiment, the reset switch $S_4$ is connected in parallel with the inverting amplifier $X_1$. That is, the first end of the reset switch $S_4$ is connected to the input end of the inverting amplifier $X_1$, and the second end of the reset switch $S_4$ is connected to the output end of the inverting amplifier $X_1$. In practice, the reset switch $S_4$ is also connected in parallel with the inverting amplifier $X_2$.

In the embodiment of the present disclosure, compared with the third embodiment, a reset switch is added in the I-V transformation circuit, so that the charges in the I-V transformation circuit may conveniently be cleared to meet requirements for detection.

It is worth mentioning that all the modules involved in this embodiment are logical modules. In practical applications, a logical unit can be a physical unit, a part of a physical unit, or a combination of multiple physical units. In addition, in order to explain the present disclosure, a unit that is not closely related to the technical problems proposed by the present disclosure has not been introduced in the above embodiments, but it does not mean that there are no other units in the embodiments.

Those skilled in the art can understand that all or part of the steps in the methods of the above-mentioned embodiments can be achieved by execution of computer programs to instruct hardware to perform one or more steps. The computer programs are stored in a storage medium, including a number of instructions to cause a device (which can be microcontrollers, a chip, etc.) or a processor to execute all or some steps of the method described in each embodiment. The previous storage media includes media such as a U disk, a mobile hard disk, a read-only memory (ROM), a random access memory (RAM), a magnetic disc or a disc, which can store computer programs codes.

It is understandable to those ordinary skilled in the art that the above embodiments are specific examples in the present disclosure, and in practical applications, various changes can be made in form and in detail without deviating from the spirit and scope of the present disclosure.

What is claimed is:

1. An I-V conversion module, comprising:
    an I-V transformation circuit comprising an input end and an inverting amplifier;
    a pre-integral circuit;
    a current output type sensor connects to the input end of the I-V transformation circuit through the pre-integral circuit, and configured to output an induction current; and
    a charge transfer auxiliary circuit connects in parallel with the inverting amplifier;
    wherein when both the pre-integral circuit and the charge transfer auxiliary circuit are open circuits, the pre-integral circuit pre-integrates the induction current so as to store pre-integral charges; when both the pre-integral circuit and the charge transfer auxiliary circuit are closed circuits, the pre-integral charges are transferred to the I-V transformation circuit.

2. The I-V conversion module according to claim 1, wherein the pre-integral circuit comprises a pre-integral energy storage unit and a pre-integral switch;
    wherein one end of the pre-integral energy storage unit connects to a first end of the pre-integral switch and the current output type sensor; the other end of the pre-integral energy storage unit is grounded;
    wherein the second end of the pre-integral switch connects to the input end of the I-V transformation circuit;
    wherein the pre-integral energy storage unit at least comprises a coupling capacitor of the current output type sensor.

3. The I-V conversion module according to claim 2, wherein the pre-integral energy storage unit comprises an adjustable energy storage element;
    wherein the adjustable energy storage element connects in parallel with the coupling capacitor.

4. The I-V conversion module according to claim 3, wherein the adjustable energy storage element comprises an adjustable capacitor.

5. The I-V conversion module according to claim 1, wherein the I-V transformation circuit comprises at least one transformation branch, each transformation branch comprises an integral energy storage element and an integral switch;
    wherein the first end of the integral energy storage element connects to the input end of the inverting amplifier, and forms the input end of the I-V transformation circuit;
    wherein the second end of the integral energy storage element connects to the first end of the integral switch, and forms an output end of the I-V transformation circuit;
    wherein an output end of the inverting amplifier connects to the second end of the integral switch.

6. The I-V conversion module according to claim 5, wherein the integral energy storage element comprises a capacitor.

7. The I-V conversion module according to claim 5, wherein the number of the transformation branches is 2.

8. The I-V conversion module according to claim 1, wherein the charge transfer auxiliary circuit comprises a plurality of inverting amplifiers that are connected in parallel with each other.

9. The I-V conversion module according to claim 1, wherein the inverting amplifier comprises an inverter or an operational amplifier.

10. The I-V conversion module according to claim 1, wherein the I-V transformation circuit further comprises a reset switch, the reset switch is connected in parallel with the inverting amplifier.

* * * * *